(12) United States Patent
Sun

(10) Patent No.: US 7,752,788 B1
(45) Date of Patent: Jul. 13, 2010

(54) CABLE CONNECTOR WITH SIGNAL TYPE INDICATOR

(75) Inventor: Zheng-Heng Sun, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/479,865

(22) Filed: Jun. 8, 2009

(30) Foreign Application Priority Data

Apr. 10, 2009 (CN) .................. 2009 1 0301462

(51) Int. Cl.
  *H01R 3/00* (2006.01)
(52) U.S. Cl. .................. 40/316; 40/673; 439/491; 439/78
(58) Field of Classification Search .......... 40/316; 439/491, 48, 78; 174/112
See application file for complete search history.

(56) References Cited

U.S. PATENT DOCUMENTS

| | | | | |
|---|---|---|---|---|
| 4,305,676 A | * | 12/1981 | Wallbank | 403/130 |
| 4,340,774 A | * | 7/1982 | Nilsson et al. | 174/138 G |
| 4,566,185 A | * | 1/1986 | Bryan | 29/845 |
| 5,533,917 A | * | 7/1996 | Schmitz | 439/894 |
| 6,283,787 B1 | * | 9/2001 | Chou | 439/488 |
| 6,916,211 B2 | * | 7/2005 | Price | 439/697 |
| 7,093,807 B2 | * | 8/2006 | Wylie | 248/49 |
| 7,559,791 B1 | * | 7/2009 | Kao et al. | 439/491 |

\* cited by examiner

*Primary Examiner*—Cassandra Davis
(74) *Attorney, Agent, or Firm*—Zhigang Ma

(57) ABSTRACT

A cable connector includes a base formed on a circuit board, a plurality of pins extending from the base and electrically connected to the circuit board, and a signal type indicator. A plurality of through holes is defined in the signal type indicator to receive the pins, and an emblem is arranged on the signal type indicator to indicate the signal type of the cable connector. The diameter of each through hole is greater than the diameter of each pin so that the pins can pass through the through holes of the signal type indicator for mounting the signal type indicator on the base.

8 Claims, 4 Drawing Sheets

CABLE CONNECTOR WITH SIGNAL TYPE INDICATOR

BACKGROUND

1. Technical Field

The disclosure relates to connectors and, more particularly, to a cable connector with signal type indicator.

2. Description of Related Art

Connectors are used to electronically connect electronic devices together, to transmit signals between the electronic devices. A computer motherboard usually requires a large number of connectors to transmit different kinds of signals. However, shapes of some connectors are the same and silkscreen printings of the corresponding descriptive information is usually too small to be identified easily. As a result, connecting external devices to corresponding connectors of the computer motherboard is inconvenient.

DETAILED DESCRIPTION

Figure 1:
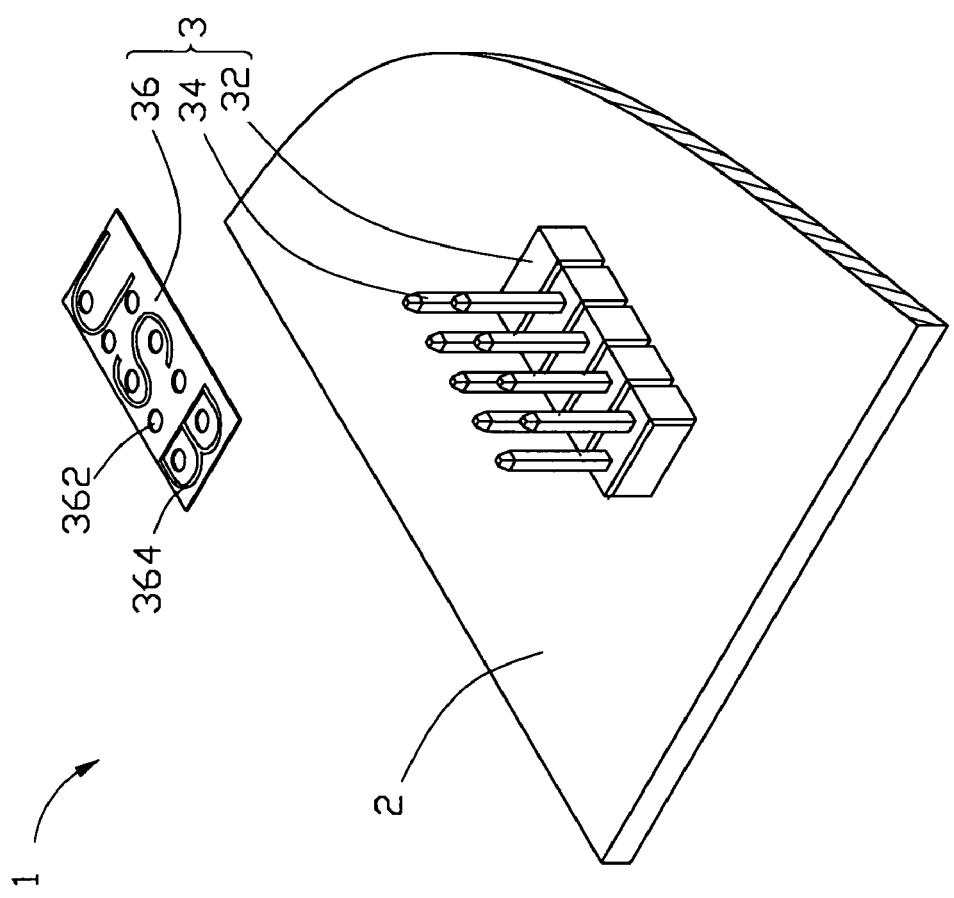
FIG. 1 is an exploded view of a computer motherboard including a substrate and a cable connector, in accordance with a first embodiment.

Referring to FIG. 1, a first exemplary embodiment of a computer motherboard 1 includes a circuit substrate 2 and a cable connector 3. The cable connector 3 includes a raised base 32 formed on the circuit substrate 2, a plurality of pins 34 extending upright from the base 32, and a signal type indicator 36. The signal type indicator 36 is a thin flat piece made of insulating material, such as hard plastic. The signal type indicator 36 defines a plurality of through holes 362 therein and an emblem 364 thereon. The emblem 364 may be, for example, a label such as "USB" or "1394", indicating signal type of the corresponding cable connector 3. The emblem 364 and the through holes 362 are interlacedly arranged on the same area of the signal type indicator 36. The diameter of each through hole 362 is greater than the diameter of each pin 34 so that the pins 34 can pass through the through holes 362 of the signal type indicator 36 for mounting the signal type indicator 36 on the base 32. The signal type indicator 36 can be fixed on the base 32 using gummy material, such as glue.

Figure 2:
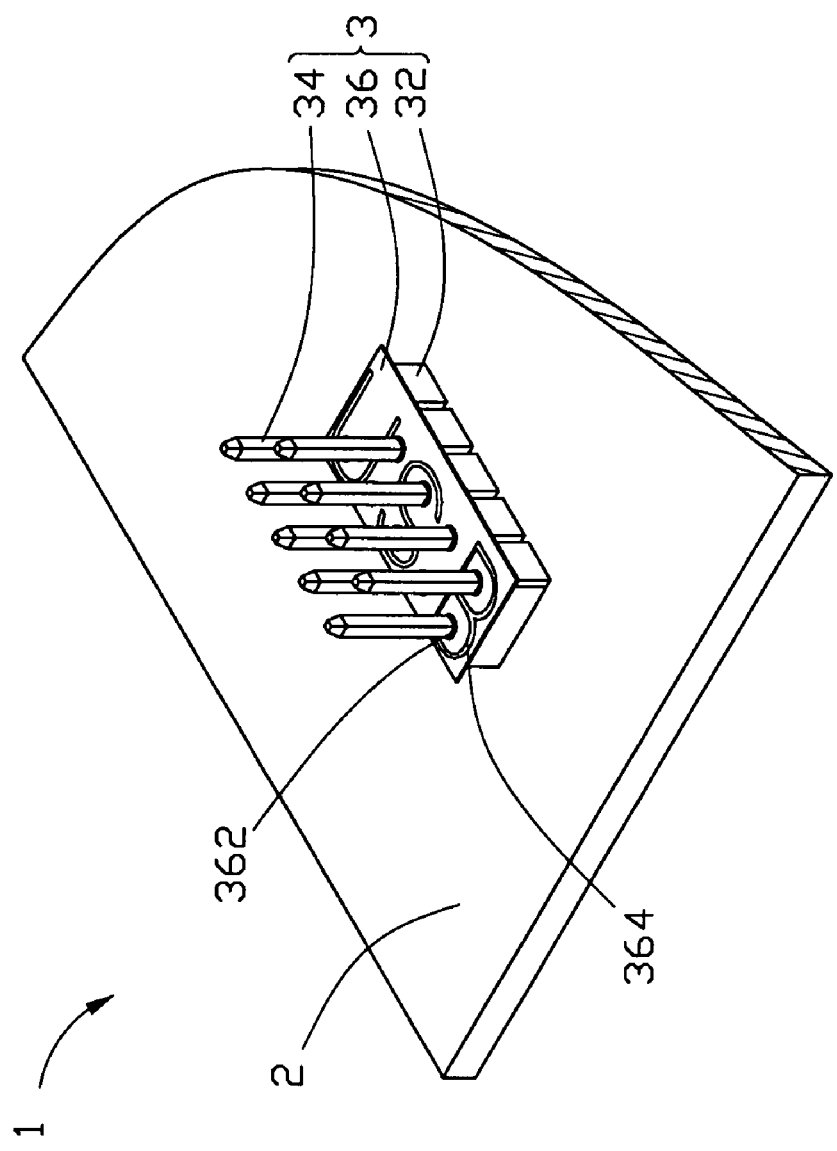
FIG. 2 is an assembled view of FIG. 1.

Referring to FIG. 2, in assembly, the signal type indicator 36 is mounted to the base 32 with the pins 34 passing through the through holes 362. Then the bottom of the signal type indicator 36 is glued on the base 32. The signal type indicator 36 is about the same size as the base 32, and the emblem 364 covers most of the signal type indicator 36 and is interlaced with the through holes 362. Therefore, the emblem 364 can be easily identified.

Figure 3:
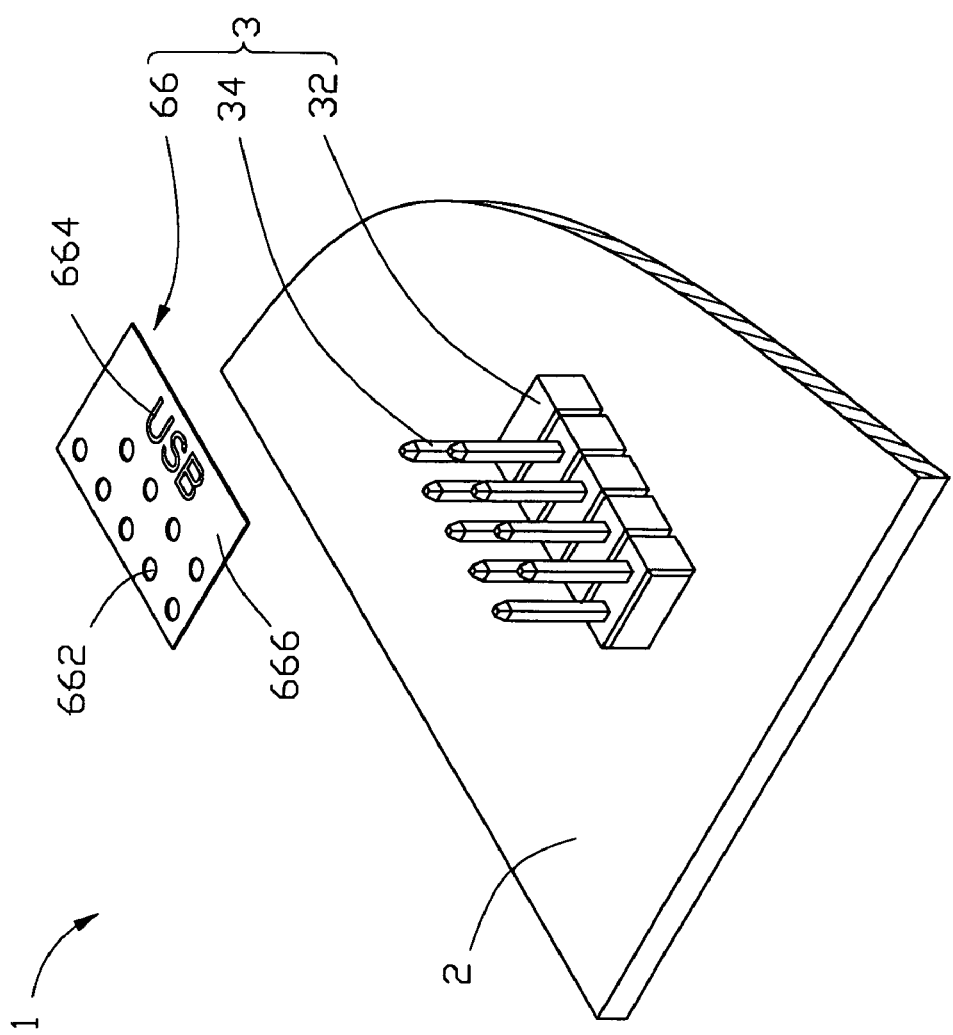
FIG. 3 is an exploded view of a computer motherboard including a substrate and a cable connector, in accordance with a second embodiment.

FIG. 3 illustrates a second exemplary embodiment of the computer motherboard 1. The difference between the first and second exemplary embodiments is that the signal type indicator 66 of the second exemplary embodiment is larger than the base 32, i.e., the indicator 66 including an extending portion 666 and a plurality of through holes 662, and an emblem 664 is set on the extending portion 666 parallel to the through holes 662.

Figure 4:
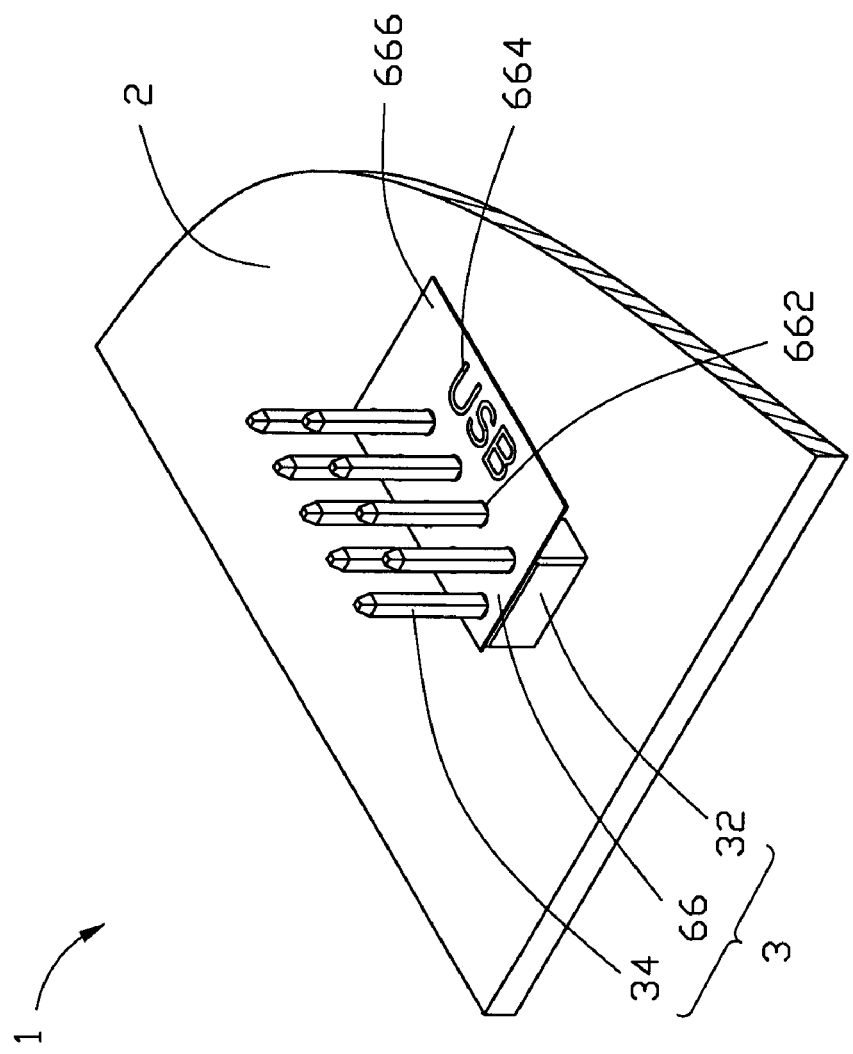
FIG. 4 is an assembled view of FIG. 3.

Referring to FIG. 4, in assembly, the signal type indicator 66 is mounted to the base 32 with the pins 34 passing through the through holes 662. Then the bottom of the signal type indicator 66 is glued on the base 32. The emblem 664 on the extending portion 666 is located beside the pins 34. Therefore, the emblem 664 can be easily identified.

The type of the signals transmitted by the cable connectors can be quickly identified by the signal type indicators of the cable connectors of the computer motherboard. Therefore, assembling the computer system becomes more convenient.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching. The embodiments were chosen and described in order to explain the principles of the disclosure and their practical application so as to enable others skilled in the art to utilize the disclosure and various embodiments and with various modifications as are suited to the particular use contemplated. Alternately embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A computer motherboard comprising:
    a circuit substrate; and
    a plurality of cable connectors, each comprising:
        a base;
        a plurality of pins extending from the base and electrically connected to the substrate; and
        a signal type indicator comprising:
            a plurality of through holes defined in the signal type indicator, to receive the plurality of pins on the base;
            an extending portion extending beyond the base; and
            an emblem set on the extending portion and formed on a surface of the signal type indicator, to indicate signal type of the corresponding cable connector;
            wherein the diameter of each of the through holes is greater than the diameter of each of the pins so that the pins can pass through the through holes of the signal type indicator for mounting the signal type indicator on the base.

2. The computer motherboard of claim 1, wherein the signal type indicator is a thin flat piece made of insulating material.

3. The computer motherboard of claim 2, wherein the signal type indicator is fixed on the base via the bottom of the signal type indicator using gummy material.

4. The computer motherboard of claim 2, wherein the emblem is "USB" upon a condition that signals transmitted by the corresponding cable connector are USB signals.

5. A cable connector comprising:
    a base formed on a circuit board;
    a plurality of pins extending from the base and electrically connected to the circuit board; and
    a signal type indicator comprising:
        a plurality of through holes defined in the signal type indicator, to receive the pins on the base;
        an extending portion extending beyond the base, and
        an emblem set on the extending portion and formed on a surface of the signal type indicator, to indicate signal type of the corresponding cable connector;

wherein the diameter of each of the through holes is greater than the diameter of each of the pins so that the pins can pass through the through holes of the signal type indicator for mounting the signal type indicator on the base.

6. The cable connector of claim 5, wherein the signal type indicator is a thin flat piece made of insulating material.

7. The cable connector of claim 6, wherein the signal type indicator is fixed on the base via bottom of the signal type indicator using gummy material.

8. The cable connector of claim 6, wherein the emblem is "USB" upon a condition that signals transmitted by the corresponding cable connector are USB signals.

* * * * *